(12) United States Patent
Suemasa et al.

(10) Patent No.: US 6,642,149 B2
(45) Date of Patent: Nov. 4, 2003

(54) PLASMA PROCESSING METHOD

(75) Inventors: Tomoki Suemasa, Nakakoma-gun (JP); Tsuyoshi Ono, Chofu (JP); Kouichiro Inazawa, Tokyo (JP); Makoto Sekine, Yokohama (JP); Itsuko Sakai, Yokohama (JP); Yukimasa Yoshida, Yokohama (JP)

(73) Assignees: Tokyo Electron Limited, Tokyo (JP); Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 10/286,789

(22) Filed: Nov. 4, 2002

(65) Prior Publication Data

US 2003/0054647 A1 Mar. 20, 2003

Related U.S. Application Data

(63) Continuation of application No. 09/397,091, filed on Sep. 16, 1999, now abandoned.

(30) Foreign Application Priority Data

Sep. 16, 1998 (JP) .................................. 10-280587

(51) Int. Cl.$^7$ ............................................. H01L 21/302
(52) U.S. Cl. ........................ 438/710; 438/711; 438/214; 438/729; 216/67
(58) Field of Search ................................ 438/710, 711, 438/714, 729; 216/67

(56) References Cited

U.S. PATENT DOCUMENTS

| | | | |
|---|---|---|---|
| 4,579,618 A | 4/1986 | Celestino et al. | 156/345 |
| 4,617,079 A | 10/1986 | Tracy et al. | 156/345 |
| 5,512,130 A | 4/1996 | Barna et al. | 216/67 |
| 5,900,103 A | 5/1999 | Tomoyasu et al. | 156/345 |
| 5,935,874 A * | 8/1999 | Kennard | 438/710 |
| 6,009,828 A * | 1/2000 | Tomita et al. | 118/723 E |
| 6,024,044 A * | 2/2000 | Law et al. | 118/723 E |
| 6,048,435 A * | 4/2000 | DeOrnellas et al. | 156/345 |
| 6,051,503 A * | 4/2000 | Bhardwaj et al. | 438/705 |
| 6,110,287 A * | 8/2000 | Arai et al. | 118/723 |
| 6,126,778 A * | 10/2000 | Donohoe et al. | 156/345 |
| 6,149,730 A * | 11/2000 | Matsubara et al. | 118/728 |
| 6,187,685 B1 * | 2/2001 | Hopkins et al. | 438/710 |
| 6,486,069 B1 * | 11/2002 | Marks et al. | 438/706 |

FOREIGN PATENT DOCUMENTS

JP    7-74159    3/1995

OTHER PUBLICATIONS

Principles of Plasma Discharges and Materials Processing, pp. 90–97, Michael A. Lieberman et al.

* cited by examiner

Primary Examiner—Robert Kunemund
Assistant Examiner—Duy-Vu Deo
(74) Attorney, Agent, or Firm—Oblon, Spivak, McClelland, Maier & Neustadt, P.C.

(57) ABSTRACT

In a processing chamber of an etching apparatus a lower electrode and an upper electrode grounded through a processing container are disposed oppositely to each other. A first high frequency power supply section composed of a first filter, a first matching device, and a first power source, and a second high frequency power supply section composed of a second filter, a second matching device, and a second power source are connected to the lower electrode. A superimposed power of two frequencies composed of a first high frequency power component of at least 10 MHz produced from the first power source and a second high frequency power component of at least 2 MHz produced from the second power source is applied to the lower electrode. Ions in the plasma do not accelerated by changes of electric field in the processing chamber, but are accelerated by a self-bias voltage and collide only against a wafer on the lower electrode.

18 Claims, 3 Drawing Sheets

PLASMA PROCESSING METHOD

BACKGROUND OF THE INVENTION

The present invention relates to a plasma processing method.

Conventionally, there has been proposed a plasma etching apparatus having a lower electrode serving also as a susceptor for an object to be processed, for example, a semiconductor wafer (hereinafter called wafer) and a grounded upper electrode disposed oppositely to each other in an airtight processing chamber. This etching apparatus is composed so as to introduce process gas into the processing chamber, evacuate the processing chamber to maintain a specified decompressed atmosphere in the processing chamber, and then apply a specified high frequency power to the lower electrode on which the wafer is placed to transform the process gas into plasma, thereby etching the wafer by the plasma as specified.

There has been recently proposed a technique where processing is performed by applying to the lower electrode a power having different frequencies, for example, as disclosed in Jpn. Pat. Appln. KOKAI Publication No. 7-74159, a superimposed power of two frequencies by superposing the high frequency power component of 60 MHz and low frequency power component of 400 kHz. In the etching apparatus employing such a power, while generating plasma of a high density by dissociating the process gas introduced into the processing chamber by the high frequency power component, ions in the plasma are accelerated by the changes of the electric field formed in the processing chamber by the low frequency power component so as to collide against the wafer.

When etching is performed by using electric power having the low frequency power component so that the ions are accelerated by changes of the electric field, the ions get higher energy and the collision energy against the wafer is increased, and the etching rate is enhanced, but the etching area may be damaged. Also the ions have a higher potential over the grounded upper electrode and/or the inner wall of the processing chamber, and they may collide excessively against the upper electrode and/or the inner wall of the processing chamber. As a result, the inner wall of the processing chamber or various grounded members disposed in the processing chamber are sputtered, the replacement frequency of these members is increased, the throughput is lowered, and the life of the etching apparatus may be shortened.

BRIEF SUMMARY OF THE INVENTION

An object of the present invention is to provide a novel and improved plasma processing method capable of performing predetermined processing on an object to be processed securely, and decreasing the replacement frequency of various members disposed in a processing chamber and extending the life of a processing apparatus, particularly by decreasing damage of the grounded inner wall of the processing chamber and the members.

To solve the problems, according to the invention, there is provided a plasma processing method for transforming process gas into plasma, in a vacuum processing chamber, by superposing and applying two different frequency power components to an electrode, and processing an object to be processed placed on the electrode by the plasma as specified, in which the lower ($f_2$) of the two high frequency components is controlled to such a frequency that ions in the plasma cannot accelerated by changes in the electric field in the processing chamber. The lower ($f_2$) of the two high frequency components is preferably a frequency higher than an ion plasma frequency of ions in the plasma, and a density of the plasma and a self-bias voltage are controlled by varying powers of two different high frequency power components.

In accordance with one aspect of the invention, since the second high frequency power component of the superimposed power to be applied to the electrode is set at a frequency ($f_2$) such that ions in the plasma cannot accelerated by changes in the electric field during processing, it is possible to lower the energy of the ions produced by the changes in the electric field in the plasma, and the ion potential can be lowered for the grounded members disposed in the processing chamber, for example, the counter electrode disposed oppositely to the lower electrode, or the inner wall in the processing chamber. As a result, the energy of ions colliding against the counter electrode or the inner wall of the processing chamber is decreased, and therefore damages to these members can be decreased, and the replacement interval of the members and the service life of the processing apparatus can be extended. In the invention, meanwhile, since the ions are mainly accelerated adequately by the self-bias voltage, preferable plasma processing can be performed.

In accordance with another aspect of the invention, the most suitable density of plasma and self-bias voltage may be obtained, according to the material to be processed (an oxide film such as silicon oxide film, a conductive layer such as Al or Cu stripe, a substrate such as silicon wafer, or the like), and the type of processing (an etching, a film formation or the like).

The frequency ($f_2$) (the lower of two different high frequency power component) is set at a high frequency relative to the ion plasma frequency of the ions which are dominant in the ion assist plasma process. Preferably the frequency ($f_2$) is at least 2 MHz and at most 10 MHz, and more preferably at least 3 MHz and at most 10 MHz.

In accordance with the present invention, the energy of the ions produced by changes in the electric field can be reliably lowered even if in a high density plasma. Moreover, by making use of the electric power of such frequency, a high self-bias voltage can be produced on the electrode, and the ions can be accelerated in desired state. In addition, since the ion acceleration period is longer, when etching the object, for example, uniform processing can be performed securely without lowering the etching rate.

Moreover, when the higher ($f_1$) of the high frequency power components is substantially at least 10 MHz in accordance with invention, the process gas introduced into the processing chamber can be reliably dissociated, and thus plasma of a high density can be produced, so that the object can be processed finely, promptly and uniformly. In this case, a maximum frequency ($f_1$) may be 200 MHz and preferably 100 MHz.

In accordance with another aspect of the invention, when a magnetic field is generated in the processing chamber, plasma of a higher density can be obtained by the cyclotron motion of electrons produced by the magnetic field. Further, it has been known that in a CVD apparatus, for forming a conductive film in a fine wiring groove or contact hole, it is necessary that a desired plasma density maintains and ions are advanced onto the bottom of the wiring groove. In such cases, the present invention may be applied.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and detailed description of the preferred embodiments given below, serve to explain the principles of the invention.

DETAILED DESCRIPTION OF THE INVENTION

Referring now to the accompanying drawings, the plasma processing method of the invention will be explained about an embodiment of application in an etching method of a capacitive coupling type plasma etching apparatus.

(1) Entire Constitution of Etching Apparatus

Figure 1:
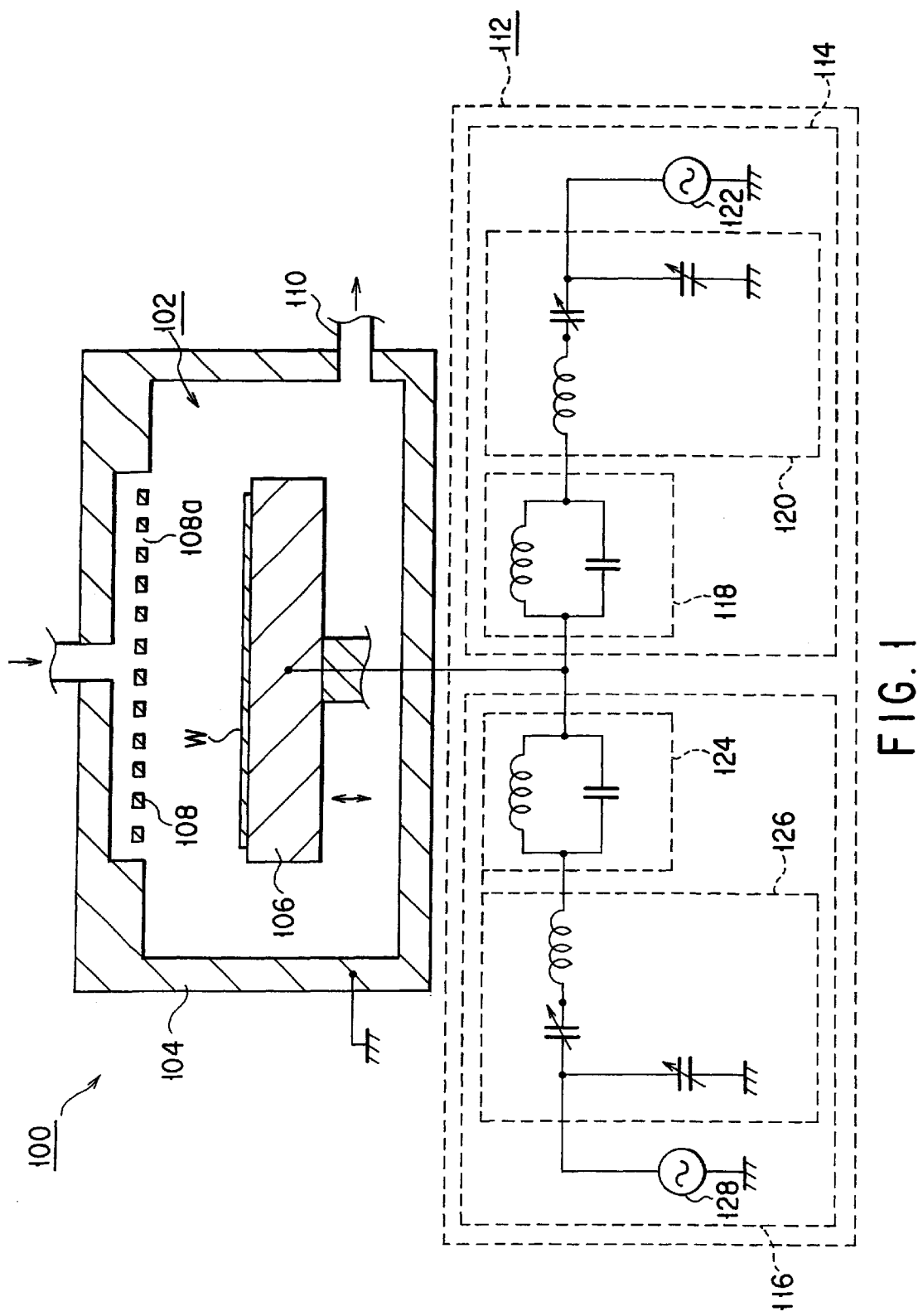
FIG. 1 is a schematic sectional view showing an etching apparatus to which the invention is applicable.

Referring first to FIG. 1, an entire constitution of an etching apparatus 100 for taking out a method according to the embodiment will be explained. A processing chamber 102 of the etching apparatus 100 is defined within a conductive air-tight processing container 104, and a conductive lower electrode 106 serving also as a susceptor for mounting a wafer W is disposed in this processing chamber 102. At a position opposite to the mounting surface of the lower electrode 106, an upper electrode 108 is provided. The upper electrode 108 is grounded through the processing container 104 in this illustrated example. The upper electrode 108 has plural gas discharge holes 108a connected to a gas supply source not shown, and a specified process gas, for example, mixed gas of $C_4F_8$, Ar and $O_2$ is supplied from the gas discharge holes 108a into the processing chamber 102. At the lower part of the processing chamber 102, further, an exhausts pipe 110 communicating with an exhaust mechanism not shown is connected, and when the processing chamber 102 is evacuated through this exhaust pipe 110, the processing chamber 102 is maintained in a specified decompressed atmosphere, for example, 40 mTorr.

To the lower electrode 106, a power supply device 112 for supplying a superimposed power of two frequencies according to the embodiment is connected. This power supply device 112 is composed of a first high frequency power supply section 114 for producing a high frequency power component ($f_1$) and a second high frequency power supply section 116 for producing a high frequency power component ($f_2$) which is lower than the first high frequency component. The first high frequency power supply mechanism 114 is composed of a first filter 118, a first matching device 120, and a first power source 122 connected sequentially from the lower electrode 106 side. The first filter 118 prevents the second high frequency power component from invading into the first matching device 120 side, the first matching device 120 matches the first high frequency power component. The first power source 122 produces high frequency power component of specified frequency ($f_1$) of the embodiment as described below. The second high frequency power supply section 116 is composed of a second filter 124, a second matching device 126, and a second power source 128 connected sequentially from the lower electrode 106 side. The second filter 124 prevents the first high frequency power component from invading into the second matching device 126 side, the second matching device 126 matches the second high frequency power component. The second power source 128 produces a second high frequency power component of a specified frequency ($f_2$) of the embodiment as described below.

(2) Relationship Between Frequency of Power and Ions in Plasma

Figure 2A:
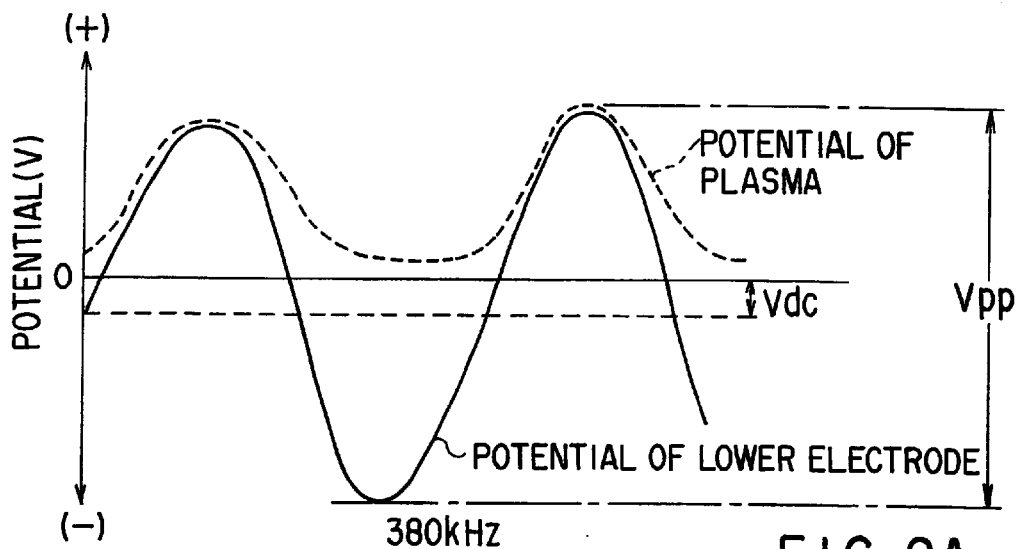
FIGS. 2A through 2C are respectively schematic explanatory diagrams for explaining the relationship between frequency of power applied to a lower electrode of the etching apparatus shown in FIG. 1, and a potential of the lower electrode and a self-bias voltage.
Figure 2B:
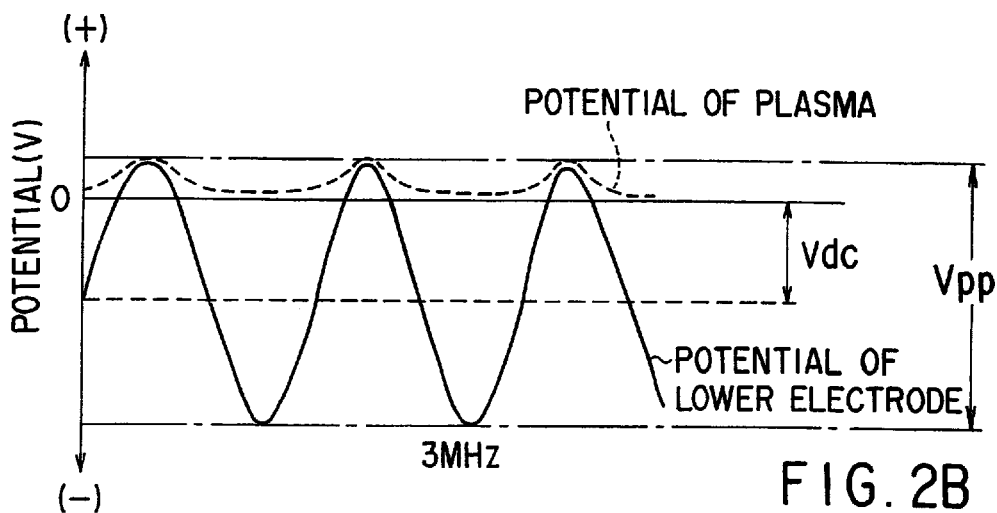
Figure 2C:
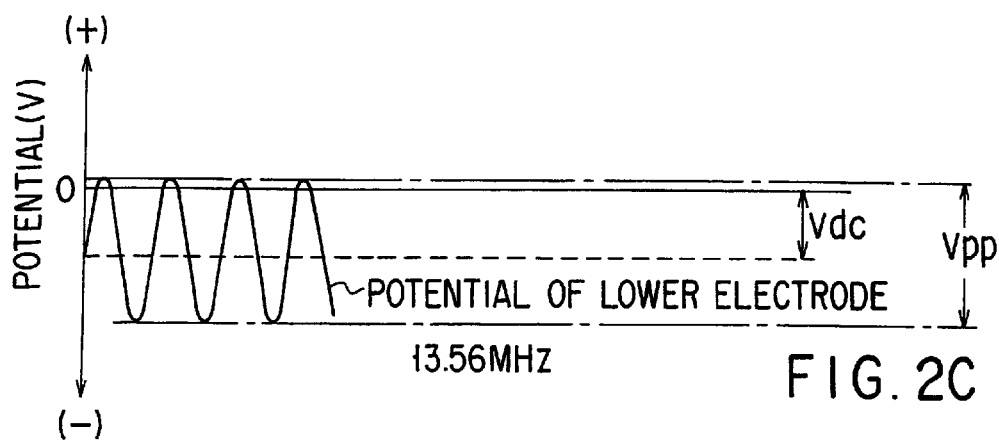

Referring next to FIGS. 2A through 2C, the relationship between the frequency of power applied to the lower electrode 106 and a potential of the lower electrode and a self-bias voltage will be described. In these figures, Ar gas is fed into the processing chamber 102 of the etching apparatus 100, the processing chamber 102 is maintained at 40 mTorr, identical powers of single frequencies of 380 kHz (FIG. 2A), 3 MHz (FIG. 2B), and 13.56 MHz (FIG. 2C) are respectively applied to the lower electrode 106 mounting the wafer W, and a potentials of the lower electrode 106, plasma potential, and self-bias voltage (Vdc) are measured.

First, as shown in FIG. 2A, when the low frequency power of 380 kHz is applied to the lower electrode 106, the potential of the lower electrode 106 fluctuates widely to positive (+) and negative (−) polarity, and a large Vpp is generated. Along with the positive fluctuation, the plasma potential, that is, the ion energy is raised, but the self-bias voltage is less generated. In this specification, Vpp refers to the difference of the maximum value and minimum value of the potentials applied to the lower electrode 106.

Then, as shown in FIG. 2B, when the high frequency power of 3 MHz is applied to the lower electrode 106, the potential of the lower electrode 106 fluctuates in a smaller width as compared with that of the low frequency power of 380 kHz, and the positive potential is smaller, and along with the decrease of the positive potential, the plasma potential is smaller. By contrast, the self-bias voltage is higher than that of the power of 380 kHz as shown in the diagram, being higher as compared with the case of the power of 13.56 MHz mentioned below.

Further, as shown in FIG. 2C, when the high frequency power of 13.56 MHz is applied to the lower electrode 106, the potential of the lower electrode 106 fluctuates in a much smaller width as compared with that of the power of 3 MHz, and the positive potential is decreased, and the plasma potential is lowered below the measurable limit. The self-bias voltage is lower than that of the high frequency power of 3 MHz but higher than that of the low frequency power of 380 kHz.

These phenomena are considered to be caused by the following reasons. That is, ions in the plasma, generally, when the frequency of the power becomes higher than the ion plasma frequency, may be no longer accelerated by fluctuations of the voltage supplied to the lower electrode 106, that is, changes of electric field in the plasma formed in the processing chamber 102. The frequency at which ions may not be accelerated by fluctuations of a high frequency voltage, that is, the ion plasma frequency is expressed in formula 1 as presented in page 92 of "Principles of Plasma Discharges and Materials Processing" (Michael A. Lierberman, Allan J. Lichtenberg; Wiley-Interscience), and page 120 of "Latest Plasma Generation Technology" (Yoshinobu kawai; IPC).

$$(e^2 n_o / \epsilon_o M)^{1/2} / 2\pi \qquad (1)$$

where e is an electric charge amount of electrons, $n_o$ is plasma density, M is the mass of ions, and $\epsilon_o$ is a dielectric constant in vacuum.

The above formula represents that more increasing the density of plasma, relatively higher the frequency of the plasma ion frequency. It may be understood from the formula (1) that, in the plasma of Ar, the plasma ion frequency of Ar becomes 1 MHz in the case of the plasma density of $10^9$ cm$^{-3}$, 2 MHz in the case of the plasma density of $4\times10^9$ cm$^{-3}$, and about 3 MHz in the case of the plasma density of $10^{10}$ cm$^{-3}$. In order to obtain a desired etching rate using the etching apparatus shown in FIG. 1, it is preferable that the plasma density is at least $4\times10^9$ cm$^{-3}$. The plasma density of more than $10^{10}$ cm$^{-3}$ is more preferable. Accordingly, when the plasma density is $4\times10^9$ cm$^{-3}$, by using a high frequency power component having a frequency of at least 2 MHz allows the ions not to be accelerated in accordance with changes of the electric field not only in the ion sheath but also in plasma.

The ions are not accelerated by the changes of the electric field, but as shown in FIG. 2B, a high self-bias voltage is generated on the lower electrode 106, that is, on the wafer W, due to difference in mobility between electrons and ions, and therefore the ions are accelerated by this self-bias voltage. That is, when the second high frequency power component to be applied to the lower electrode 106 is higher than the ion plasma frequency of 2 MHz, the ions are substantially accelerated by the self-bias voltage alone. As a result, the ions are accelerated with respect to the wafer W, but not accelerated so much with respect to directions other than toward the wafer W, that is the grounded upper electrode 108 and inner wall of the processing chamber 102, so that the energy colliding against them can be alleviated.

By contrast, when the frequency of the low frequency power component applied to the lower electrode 106 shown in FIG. 2A is less than 2 MHz, in particular, at the aforesaid low frequency of 380 kHz, or at most 1 MHz, contrary to the description above, the ions are accelerated by changes of the electric field, and get a high ion energy by this acceleration. Further, in the case of the power at such frequency, the self-bias voltage is lower, and therefore ions are substantially accelerated only by changes of the electric field. As a result, the ions have a high ion energy with respect to the grounded upper electrode 108 and inner wall of the processing chamber 102, and the ions collide against not only the wafer W but also the upper electrode 108 and the inner wall of the processing chamber 102, and these members are sputtered. It is to be understood that the chamber wall may constitute part of the ground electrode (i.e., in combination with the upper electrode) or, the chamber wall may not be an electrode surface depending upon the chamber design, and the present invention is applicable to either situation.

Therefore, in this embodiment, two different high frequency power components for composing the superimposed power of two frequencies are selected properly depending on the etching process from at least 2 MHz, preferably 3 MHz or more capable of accelerating the ions substantially by the self-bias voltage alone. That is, the second high frequency power component ($f_2$) is set at at least 2 MHz. Also, as shown in FIG. 2C, when the second high frequency power component is too high, the self-bias voltage becomes low, so that a desired ion assist effect may be not obtained. Accordingly the second high frequency power component is preferably less than 10 MHz.

Figure 3:
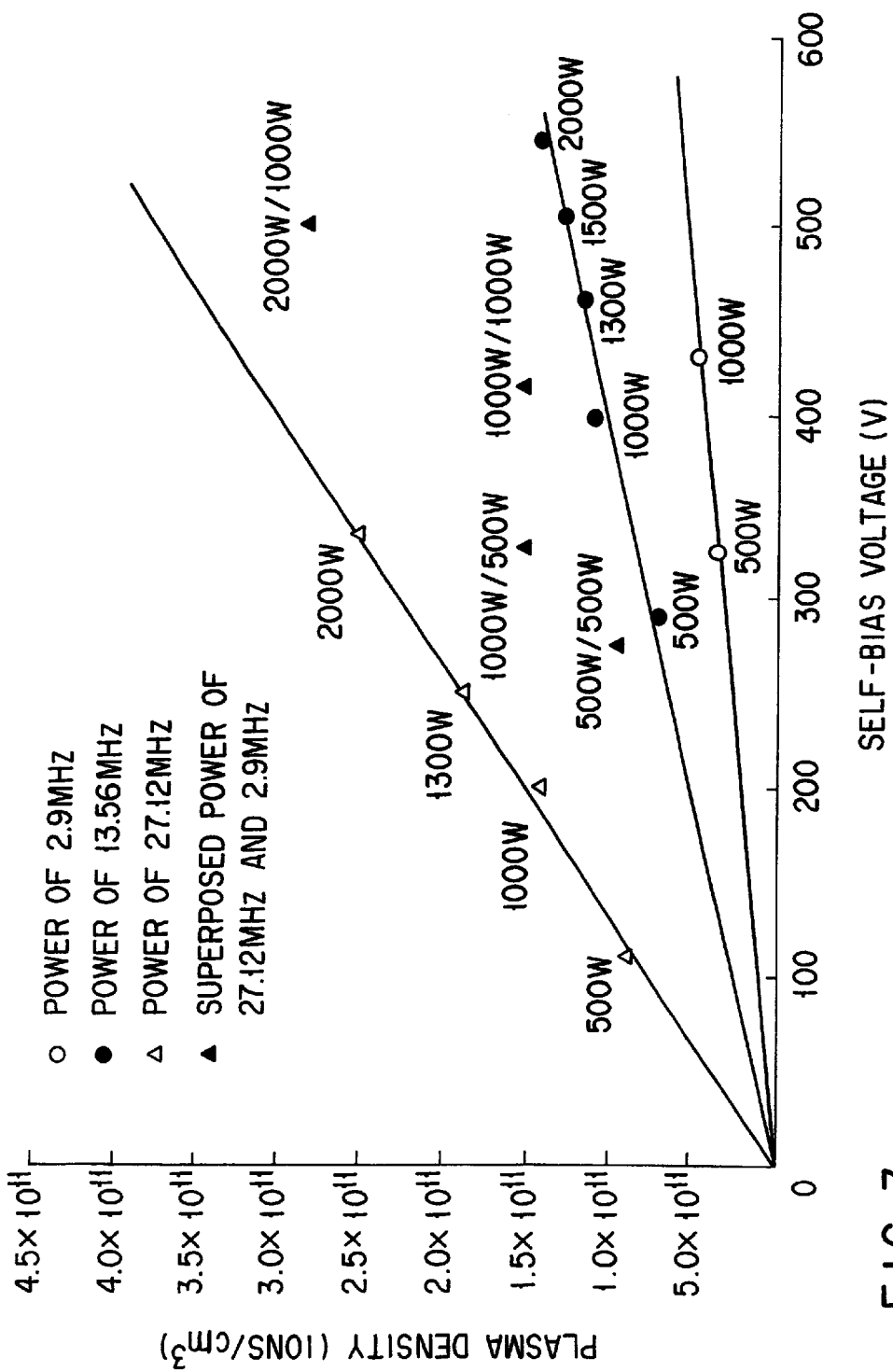
FIG. 3 is a schematic explanatory diagram for explaining the relationship between the power of each frequency applied to the lower electrode of the etching apparatus shown in FIG. 1, and the self-bias voltage and plasma density.

(3) Setting of First High Frequency Power Component and the Second High Frequency Power Component Referring now to FIG. 3, explained below will be the setting of two frequencies of the first and second high frequency power components for composing the superimposed power of two frequencies to be applied to the lower electrode 106. In FIG. 3, respective powers of single frequencies of 2.9 MHz, 13.56 MHz, and 27.12 MHz, and a superimposed two frequencies composed of power of 2.9 MHz and power of 27.12 MHz are applied to the lower electrode 106 in the same conditions as above, and the self-bias voltage and plasma density are shown. In the diagram, 500W/500W, 1000W/1000W, etc., represent the electric power of 27.12 MHz/electric power of 2.9 MHz, respectively.

As shown in this diagram, when the powers of single frequencies of 2.9 MHz, 13.56 MHz, and 27.12 MHz are respectively applied to the lower electrode 106, the self-bias voltage on the wafer W and the plasma density generated in the processing chamber 102 are increased in proportion to the magnitude of the electric power. When the same power is applied to the lower electrode 106, the self-bias voltage decreases along with increase of the frequency of the power, while the plasma density increases, contrary to the self-bias voltage, along with elevation of the frequency of the power.

As known from the result, as the electric power for generating the plasma by dissociating the process gas fed into the processing chamber 102, it is preferred to employ the power of a first high frequency, and as the power for generating the self-bias voltage, it is preferred to employ the power of a second high frequency which is lower than the first high frequency component, that is, the power at a frequency of 2 MHz to 10 MHz.

Accordingly, as shown in the diagram, when the superimposed power of two frequencies superposing the first high frequency power component of 27.12 MHz capable of generating plasma of a high density produced from the first power source 122 and the second high frequency power component of 2.9 MHz capable of forming a high self-bias voltage produced from the second power source 128 is applied to the lower electrode 106, by the mutual action of each power, as compared with the power of the single frequency set at the same power, plasma of a higher density can be generated, and the self-bias voltage can be maintained at a specified voltage. For example, in the case of the superimposed power of two frequencies setting the power of the first high frequency power component at 1000W and the power of the second high frequency power component at 500W, the plasma density is about $1.5\times10^{11}$ (the number of ions/cm$^3$), being higher than the plasma density of about $1.4\times10^{11}$ (the number of ions/cm$^3$) in the case of application of power of 1000W at 27.12 MHz. When the superimposed power of two frequencies is applied, the self-bias voltage is about 320V, which is nearly same as in the case of the power of 500W at 2.9 MHz.

When applying only the power of the single frequency to the lower electrode 106, the processing conditions can be selected only on the straight line shown in the diagram, but in the case of the superimposed power of two frequencies, by contrast, an arbitrary process can be selected in a region enclosed by the straight line of the power of 27.12 MHz and the straight line of the power of 2.9 MHz in the diagram. Moreover, by using the superimposed power of two frequencies, the specified self-bias voltage can be generated by the second high frequency power component, and the plasma of a higher density can be generated by the first high frequency power component. As a result, by properly adjusting the first high frequency power component and the second high frequency power component, the plasma density and the self-bias voltage can be adjusted, so that a desired plasma processing is realized. When the frequency of the second high frequency power component is substantially about 3.0 MHz, as compared with the case of using low frequency power component of 1 MHz or lower, the difference between the frequency of high frequency power component and frequency of side band of high frequency power component (27.12 MHz+/−3 MHz) is relatively large, and it is possible to prevent, without using a filter having a steep characteristic, invasion of first high frequency power component into the second high frequency power supply mechanism 116 side, or invasion of the second high frequency power component into the first high frequency power supply mechanism 114 side.

Also when the high power of 40 MHz to 60 MHz is applied, more high density plasma may be obtained.

A preferred embodiment of the invention has been described so far while referring to the accompanying drawings, but the invention is not limited to such constitution alone. Within the range of the technical concept disclosed in the claims, those skilled in the art can devise various changes and modifications and all changes which come within the meaning and range of equivalency of the claims are therefore intended to be embraced within the technical scope of the invention.

For example, in the illustrated embodiment, the etching apparatus does not have a magnet for producing a magnetic field in the processing chamber, but the invention is not limited to this constitution alone, but the invention may be also applied to a magnetron plasma processing apparatus having a magnet for producing a magnetic field in the processing chamber. In such a case, since electrons induce cyclotron motion by magnetic field, and plasma of higher density can be generated.

According to the invention, since the ions in the plasma do not accelerated by changes of electric field in the processing chamber, the energy of the ions can be suppressed low, and the potential of the ions to the grounded members disposed in the processing chamber can be decreased. As a result, the collision energy of the ions to the members is decreased, and the service life of these members can be extended. Moreover, as compared with the case of application of power composed only of a high frequency power component to the electrode, the ion energy to the object to be processed is enhanced, so that high speed etching process is realized also in the etching material requiring high ion energy such as silicon oxide film.

Additional advantages and modifications will readily occur to those skilled in the art. Therefore, the invention in its broader aspects is not limited to the specification detailed and representative embodiments shown and described herein. Accordingly, various modification and changes may be made without departing from the spirit or scope of the general inventive concept as defined by the appended claims and their equivalents.

We claim:

1. In a plasma processing method for transforming process gas into plasma, in a vacuum processing chamber, by superposing and applying a first high frequency power component of a frequency ($f_1$) and a second high frequency power component of a frequency ($f_2$) which is lower than the frequency ($f_1$), to an electrode, and processing an object to be processed placed on the electrode by said plasma, the improvement in that said frequency ($f_2$) is controlled to such a frequency that ions in the plasma are not accelerated by changes in an electric field in the processing chamber generated by the second high frequency power component, wherein the frequency ($f_2$) is a frequency higher than an ion plasma frequency of ions in the plasma, and wherein the ion plasma frequency of ions in the plasma is $$\frac{(e^2 n_o / \varepsilon_o M)^{1/2}}{2\pi}$$

wherein e is an electric charge amount of electrons, $n_o$ is a plasma density, M is a mass of ions, and $\varepsilon_o$ is a dielectric constant in vacuum.

2. A plasma processing method of claim 1, wherein the frequency ($f_2$) is a high frequency relative to the ion plasma frequency of ions in the plasma.

3. A plasma processing method according to claim 1, wherein the frequency ($f_2$) is 2 MHz to 10 MHz and the frequency ($f_1$) is at least 10 MHz.

4. A plasma processing method according to claim 3, wherein a magnetic field is generated in the processing chamber.

5. A plasma processing method according to claim 1, wherein the frequency ($f_2$) is 3 MHz to 10 MHz and the frequency ($f_1$) is at least 10 MHz.

6. A plasma processing method according to claim 5, wherein a magnetic field is generated in the processing chamber.

7. A plasma processing method according to claim 1, wherein the frequency ($f_2$) is 3 MHz and the frequency ($f_1$) is at least 10 MHz.

8. A plasma processing method according to claim 7, wherein a magnetic field is generated in the processing chamber.

9. In a plasma processing method for transforming process gas into plasma, in a vacuum processing chamber, by superposing and applying a first high frequency power component of a frequency ($f_1$) and a second high frequency power component of a frequency ($f_2$) which is lower than the frequency ($f_1$), to an electrode, and processing an object to be processed placed on the electrode by said plasma, the improvement in that the frequency ($f_2$) is a frequency higher than an ion plasma frequency of ions in the plasma, and a density of the plasma and a self-bias voltage are controlled by varying powers of the first and second high frequency power components, wherein the ion plasma frequency of ions in the plasma is $$\frac{(e^2 n_o / \varepsilon_o M)^{1/2}}{2\pi}$$

wherein e is an electric charge amount of electrons, $n_o$ is a plasma density, M is a mass of ions, and $\varepsilon_o$ is a dielectric constant in vacuum.

10. A plasma processing method according to claim 9, wherein the frequency ($f_2$) is 2 MHz to 10 MHz and the frequency ($f_1$) is at least 10 MHz.

11. A plasma processing method according to claim 10, wherein a magnetic field is generated in the processing chamber.

12. A plasma processing method according to claim 9, wherein the frequency ($f_2$) is 3 MHz to 10 MHz and the frequency ($f_1$) is at least 10 MHz.

13. A plasma processing method according to claim 12, wherein a magnetic field is generated in the processing chamber.

14. A plasma processing method according to claim 9, wherein the frequency ($f_2$) is 3 MHz and the frequency ($f_1$) is at least 10 MHz.

15. A plasma processing method according to claim 14, wherein a magnetic field is generated in the processing chamber.

16. A plasma processing method as recited in claim 1, wherein said plasma processing method is an etching process.

17. A plasma processing method as recited in claim 9, wherein said plasma processing method is an etching process.

18. In a plasma processing method for transforming process gas into plasma, in a vacuum processing chamber, by superposing and applying a first high frequency power component of a frequency ($f_1$) and a second high frequency power component of a frequency ($f_2$) which is lower that the frequency ($f_1$), to an electrode, and processing an object to be processed placed on the electrode by said plasma, the improvement in that the frequency ($f_2$) is a frequency higher than an ion plasma frequency of ions in the plasma, and wherein the ion plasma frequency of ions in the plasma is:

$$\frac{(e^2 n_o / \varepsilon_o M)^{1/2}}{2\pi}$$

wherein e is an electric charge amount of electrons, $n_o$ is a plasma density, M is a mass of ions, and $\varepsilon_o$ is a dielectric constant in vacuum.

* * * * *